United States Patent [19]

Duncan et al.

[11] Patent Number: 4,711,971
[45] Date of Patent: Dec. 8, 1987

[54] THERMOELECTRIC SI-GE ALLOY COMPOSITION

[75] Inventors: William Duncan; Arthur J. Barlow, both of Glasgow, Scotland

[73] Assignee: The University Court of the University of Glasgow, Glascow, Scotland

[21] Appl. No.: 805,507

[22] Filed: Dec. 5, 1985

[30] Foreign Application Priority Data

Dec. 8, 1984 [GB] United Kingdom ............... 8431071

[51] Int. Cl.$^4$ .................. H01L 35/20; C22C 28/00
[52] U.S. Cl. .................................. 136/211; 136/217; 136/239; 252/62.3 T; 420/556; 420/578
[58] Field of Search ............... 420/556, 578; 136/211, 136/239, 217; 252/62.3 T

[56] References Cited

U.S. PATENT DOCUMENTS

| | | | |
|---|---|---|---|
| 3,007,988 | 11/1961 | Jaffe et al. | 136/239 |
| 3,081,361 | 3/1963 | Henderson et al. | 252/62.3 T |
| 3,782,927 | 1/1974 | Nicolaou | 136/239 |

OTHER PUBLICATIONS

M. C. Nicolaou, Device for Direct Thermoelectric Energy Conversion with a High Efficiency.

*Primary Examiner*—L. Dewayne Rutledge
*Assistant Examiner*—Robert L. McDowell
*Attorney, Agent, or Firm*—Pennie & Edmonds

[57] ABSTRACT

A thermoelectric alloy composition is described comprising from 5% to 95% silicon, from 95% to 5% Germanium, from 0.01% to 0.2% lead and from 0% to 0.2% tin, all percentages being atomic percentages. In a preferred composition at least 50% silicon and 50% Germanium is present with 0.03% to 0.1% lead and from 0 to 0.05% tin. Tin and lead in combination provide lower thermal conductivity and a greater figure of merit than with lead or tin alone. Other preferred compositions are provided and a thermoelectric material and a p-n coupling thermoelectric generator (10) incorporating the alloy is disclosed. The alloy composition provides high efficiency of power to heat loss and minimizes running costs.

19 Claims, 9 Drawing Figures

THERMOELECTRIC SI-GE ALLOY COMPOSITION

The present invention relates to alloy compositions and particularly, but not exclusively, to thermoelectric alloy compositions.

Certain alloys are known to have thermoelectric properties which enables them to be used on order to generate or absorb heat when subjected to a suitable applied voltage or to generate electricity when heated. Satisfactory thermoelectric alloy compositions should have a high power output and low thermal conductivity. An alloy should therefore have a high Seebeck coefficient which is a measure of its voltage change with temperature, and a high electrical conductivity because the combination of these parameters defines power. The alloy composition should have minimal heat loss and therefore is selected to have low thermal conductivity. The alloy composition should also use readily available materials to minimise costs for widespread application. Furthermore the efficiency of a thermoelectric element, which is defined as the ratio of power output to heat loss (thermal conductivity) should be as high as possible to minimise running costs of a thermoelectric device.

Some previously known alloy compositions are however, very expensive. This makes them uneconomic for many application. They also have relatively low maximum operating temperature limits which limits the efficiency of electricity generation therewith. Thus alloys such as bismuth-telluride may be damaged above 200° C. and involve capital costs of the order of 100 pounds sterling per watt of generating capacity.

There are other proposed alloy compositions of silicon germanium with various other materials such as gallium, arsenic, tin and boron for applications such as solar cells, and other silicon-germanium alloy compositions for use as thermoelectric elements in which chromium and tungsten are added. None of these compositions is believed to provide an efficient low cost thermoelectric generator which is straight forward to fabricate and which has low running costs.

It is an object of the present invention to avoid or minimize one or more of the above disadvantages.

This is achieved by providing a silicon-germanium alloy composition and adding to the composition small amounts of tin or lead or both. The amounts added are less than 1% and selecting of proportions results in alloy compositions having high efficiency and low running costs.

Accordingly in one aspect of the present invention there is provided a thermoelectric alloy comprising from 5% to 95% of silicon, from 95% to 5% of germanium, from 0.01% to 0.2% of lead and from 0 to 0.2% of tin, all percentages being atomic percentages.

Preferred alloys of the present invention include those having the following compositions:

(1).

atomic percentage of silicon 50% to 95%
atomic percentage of germanium 5% to 50%, and
atomic percentage of lead 0.01% to 0.2%

(2).

atomic percentage of silicon 50% to 95%,
atomic percentage of germanium 5% to 50%, and
atomic percentage of lead 0.01% to 0.1%.

(3).

atomic percentage of silicon 50% to 95%,
atomic percentage of germanium 5% to 50%,
atomic percentage of lead 0.01% to 0.2%, and
atomic percentage of tin 0% to 0.2%; and (4).

atomic percentage of silicon 50% to 95%,
atomic percentage of germanium 5% to 50%,
atomic percentage of lead 0.03% to 0.1%, and
atomic percentage of tin 0% to 0.05%.

It will be appreciated that other compositions may be used. For example, one composition may be a thermoelectric alloy comprising 50% to 95% silicon, 5% to 50% germanium, 0.03% to 0.01% lead and from 0% to 0.2% of tin, all percentages being atomic percentages. Another suitable thermoelectric alloy composition comprises from 5% to 95% of silicon, from 95% to 5% of germanium, from 0.03% to 0.01% lead and from 0% to 0.2% of tin, all percentages being atomic percentages. In addition, another suitable thermoelectric alloy composition comprises 50% to 95% silicon, from 5% to 50% germanium, from 0.1% to 0.2% lead and from 0% to 0.05% of tin, all percentages being atomic percentages.

Desirably the alloys of the invention are substantially pure and contain not more than 1 in $10^4$ parts, most desirably not more than 1 in $10^6$ parts, by weight of undersired impurity, prior to any doping that may be desired as described below.

The above alloys may be doped with a suitable doping material to provide thermoelectric semi-conductor materials. Thus the present invention also extends to a semi-conductor material comprising an alloy of the invention which contains an effective amount of a suitable doping material.

Accordingly, in another aspect of the invention there is also provided a thermoelectric semi-conductor material comprsing an alloy of 5% to 95% of silicon, from 95% to 5% germanium, from 0.01% to 0.2% lead and from 0% to 0.2% of tin, all percentages being atomic percentages and a dopant material having a concentration in the region of $10^{18}$ to $10^{20}$ atoms of said dopant material per cubic centimeter of said alloy.

Suitable doping materials include elements belonging to Group III of the Periodic Table, for example boron and gallium, and Group V of the Periodic Table, for example Phosphorous or arsenic. Suitable concentrations of the doping materials are generally in the range from $10^{18}$ to $10^{20}$ atoms of doping element per cubic centimeter of the doped alloy.

Semi-conductor materials in accordance with the present invention generally have improved thermoelectric efficiency and/or are more economical to produce and to run than previously known thermoelectric alloys.

The semi-conductor materials of the present invention may be used in various conventional thermoelectric devices including, for example, electricity generators or catalytic fuel gas burners, and heat pumps including both devices for heat generation and heat absorption. In addition there are now provided by the present invention thermoelectric solar tiles and heat sinks using semi-conductor materials of the present invention.

The various alloys and semi-conductor materials have a number of different advantages to a greater or lesser degree depending on their precise composition, over previously known such materials. Thus for example those alloys and materials which contain little or no germanium are generally cheaper than the known materials. Those alloys and materials which contain lead have appreciably reduced thermal conductivities by a factor of 2 to 3 over optional value of silicon-germanium without degrading electrical characteristics resulting in significantly reduced heat losses due to thermal conduction in devices using these alloys and materials. Furthermore those alloys and materials comprising essentially silicon and germanium with tin and/or lead generally have significantly higher operating temperatures than bismuth-telluride, e.g. up to 700° to 800° C. or even 1000° C. in some cases as compared with an upper operating limit of some 200° C. for commonly used materials such as bismuth-telluride alloys. This, in turn, can result in substantially higher efficiency in electricity generation by permitting much higher temperatures to be used for the thermal input at the 'hot'-junction of the thermoelectric cell. Thus the present invention also extends to thermoelectric cells for electricity generation, which cells use n and p semi-conductor materials of the invention, as well as thermoelectric devices for heat absorption or generation application of a suitable external voltage, again using semi-conductor materials of the invention.

In yet another aspect of the present invention there is provided a thermoelectric device comprising at least one p-type semi-conductor portion and at least one n-type semi-conductor material portion according to the invention, said p-type having a first end electrically coupled to a first end of said n-type portion to form a p-n coupling, said p-n coupling having first electrical conductor means coupled thereto, said p and n-type portions having respective other ends for receiving respective, electrical contacts, and being connectable to an electrical load, the arrangement being such that, in use, in response to thermal energy applied to said p-n coupling electrical power can be obtained by connecting said electrical load between said electrical contacts.

Preferably a plurality of p-n couplings are provided with each p and n-type portion being electrically connected in series, and physically arranged in parallel, and electrical power being taken between any pair of p and n end portions.

In yet another aspect of the present invention there is provided a thermoelectric energy conversion device for generating electrical energy from thermal energy, said device comprising a thermal energy source, and a thermoelectric device according to the invention, the arrangement being such that in use, thermal energy from said thermal energy source is applied to said thermoelectric device to provide electrical power from between said electrical contacts.

In a further aspect of the invention there is provided a method of converting thermal energy to electrical energy using a thermoelectric device according to the invention, said method comprising the steps of heating said p-n couplings to a predetermined temperature, and coupling the electrical contacts of said device across an electrical load.

Conveniently the thermal energy applied is at a temperature up to 1000° C.

Further features and advantages of the present invention will appear from the following detailed description given by way of example of some embodiments, partially illustrated with reference to the accompanying drawing in which.

Figure 1:
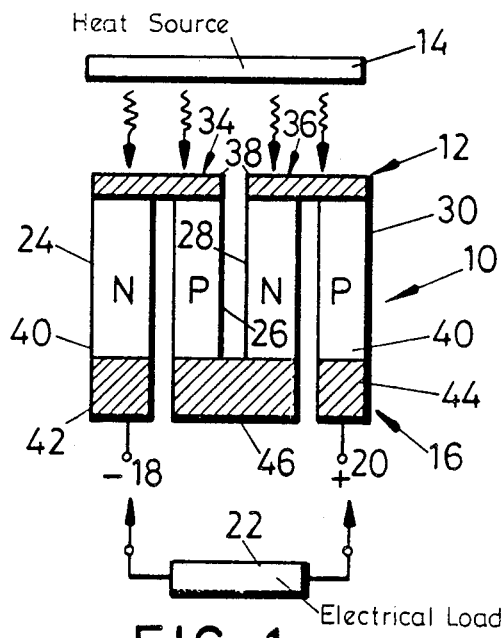
FIG. 1 is a diagrammatic representation of a thermoelectric device having a pair of p-n couplings in accordance with an embodiment of the invention.

Reference is first made to FIG. 1 which shows a thermoelectric cell 10 having a hot end 12 to which heat is supplied via a thermal source 14 for example a flame of burning fuel gas, such as propose propane. The cell 10 also has a cold end 16 with electrical output connections 18,20 to which can be coupled an electrical load 22. In more detail the cell 10 comprises n- and p -doped material elements 24,28 and 26,30 electrically connects in series but physically disposed generally parallel to each other and spaced apart. Hot ends 34 and 36 respectively of element 24,26 and 28,30 are coupled together by heat resistant and generally inert low electrical resistance conducts 38 which may be copper or a suitable low resistance material which can be used at high temperatures, for example nickel. The p and n elements 24,30 have cold ends 40 the two outer most ends of which 42,44 connected to the electrical output connections 18,20.

At their cold ends 40 the adjacent elements 26,28 are linked by copper conductor 46.

In operation of a device such as illustrated above with a pair of n-and p-doped elements, the hot end 12 of the cell was heated to about 600° C. whilst the cold end 16 was maintained at ambient or slightly above ambient temperature, about 27° C., resulting in an electrical power output of 3 watts at 0.3 volts per pair of p-n elements being obtained.

Figure 2:
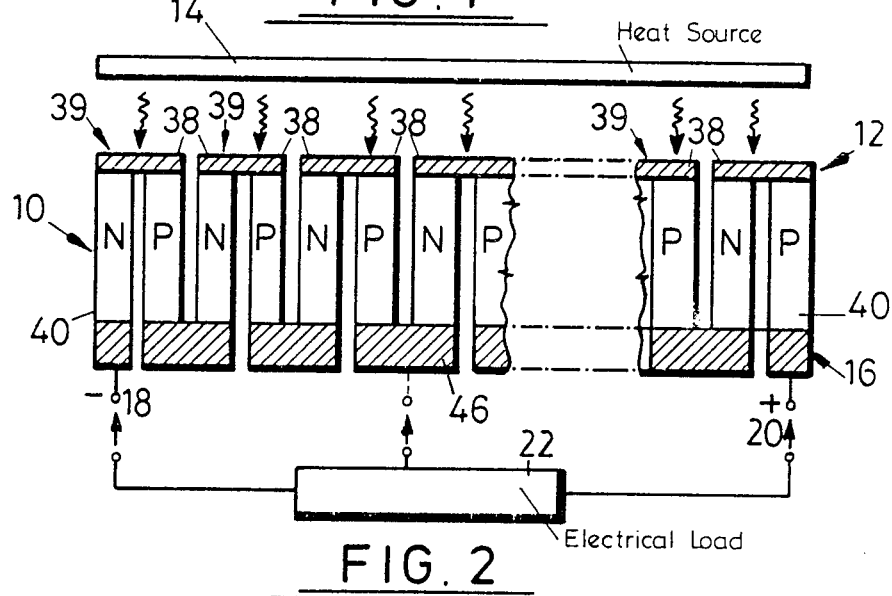
FIG. 2 is a diagrammatic view of a thermoelectric device according to another embodiment of the invention having a plurality of p-n couplings.

Reference is now made to FIG. 2 of the drawings illustrating a plurality of p and n-type semi-conductor couplings 39 as shown in FIG. 1 arranged to form a commercial type thermoelectric cell, in which like numerals refer to like parts of FIG. 1. The p and n elements can, of course be stacked or laminated to form a physically compact and lightweight structure. The heat source 14 heats all conductors 38 and electrical power can be taken from electrical output connections 18,20 as shown or at any of the suitable positions along copper conductors 46.

Figure 3:
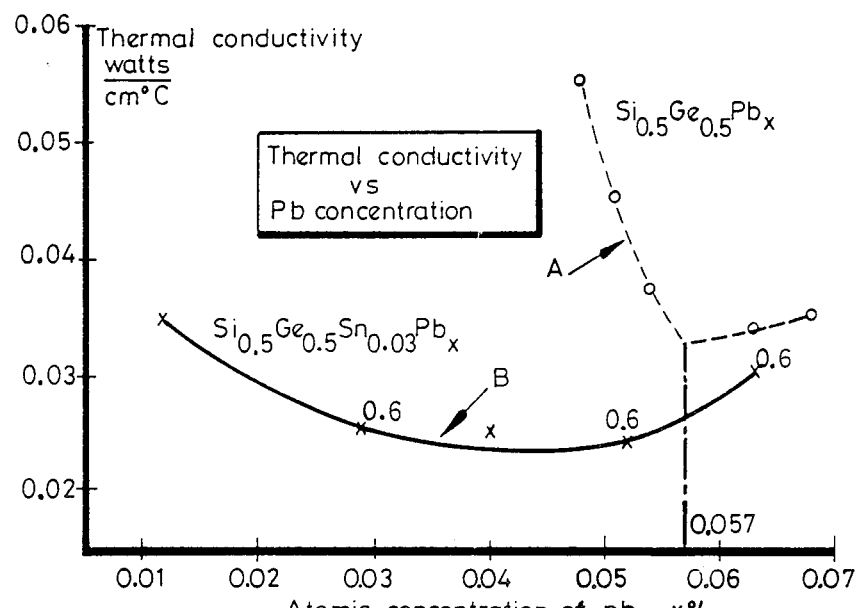
FIG. 3 is a graph of thermal conductivity versus lead concentration of a preferred alloy in accordance with the invention.

Reference is now made to FIG. 3 of the drawings which depicts a graph of thermal conductivity against lead atomic concentration for a silicon-germanium alloy of 50:50. Two curves are drawn, curve A for lead only and curve B in which the alloy includes 0.03% tin by atomic percentage. It will be seen from curve A that increasing lead concentration reduces thermal conductivity until a concentration of about 0.057% lead is obtained whereupon the thermal conductivity slightly increases for further increases of lead. Curve B is best fit curve and shows a minimum thermal conductivity at about 0.04% lead and a comparison of curves A,B indciates that thermal conductivity is lower with a lead-tin combination than with lead alone.

Figure 4:
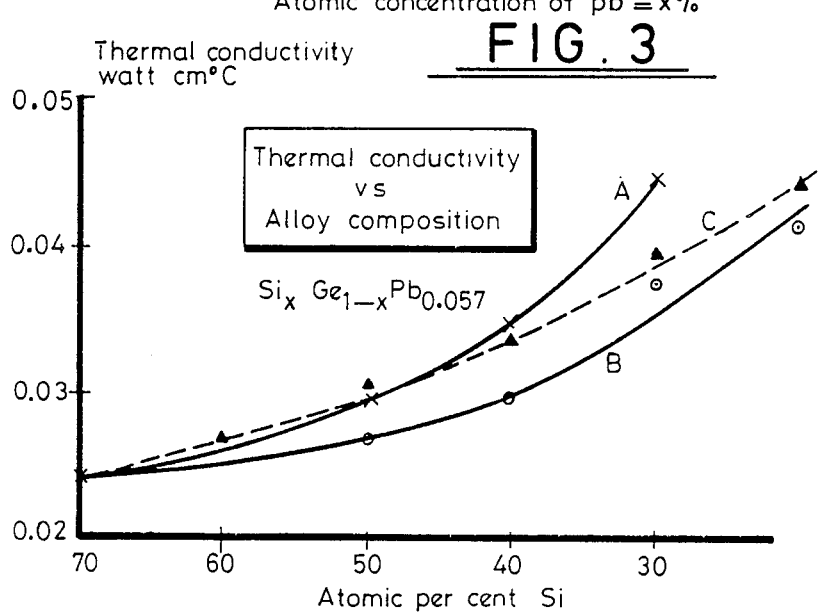
FIG. 4 is a graph of thermal conductivity versus alloy composition for a lead composition of 0.057.

FIG. 4 depicts a graph of thermal conductivity against alloy compositions for the lead value of 0.057% lead obtained in FIG. 1. Three curves A,B and C are shown, curve A is obtained using an alloy composition grown parallel to the <111>crystallographic direction; curve B is obtained using an alloy composition grown perpendicular to the <111>direction, and curve C is a theoretical curve. It will be seen for all curves that thermal conductivity is considerably lower for high Si proportions. However, increasing the lead concentration with a silicon concentration less than 30% also reduces the thermal conductivity.

Figure 5:
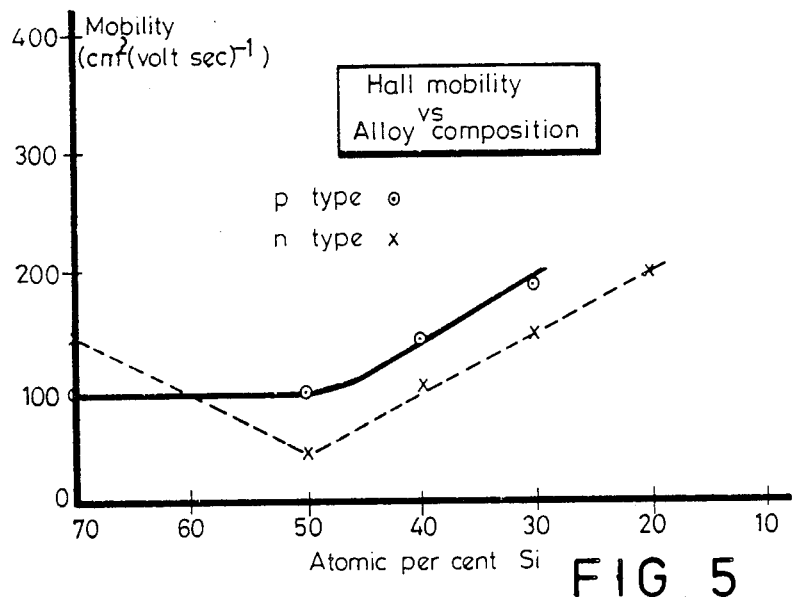
FIG. 5 is a graph of Hall mobility versus alloy composition for p and n type semi-conductor thermoelectric material in accordance with the invention.

FIG. 5 depicts a graph of Hall mobility versus alloy compositions and for p and n type compositions. It shows that there is some differences due to the difference in mobility between electrons (n-type) and holes (p-type) and that mobility generally increases for both p and n for decreasing proportions of silicon and increases for n-type for higher proportions of silicon. This is significant because electrical conductivity is directly related to Hall mobility as follows.

$\sigma_n$=for n-type n=n.e $\mu$n  (1) where $\mu_n$=mobility of electrons $\sigma_p$=for p-type p=n.A $\mu$p  (2) where $\mu_p$=mobility of holes Therefore, the composition can be selected for high conductivity to give high Seebeck coefficient. Also from equations (1) and (2) it will be evident mobility electrons and holes decreases with increasing electron and hole concentrations.

Figure 6:
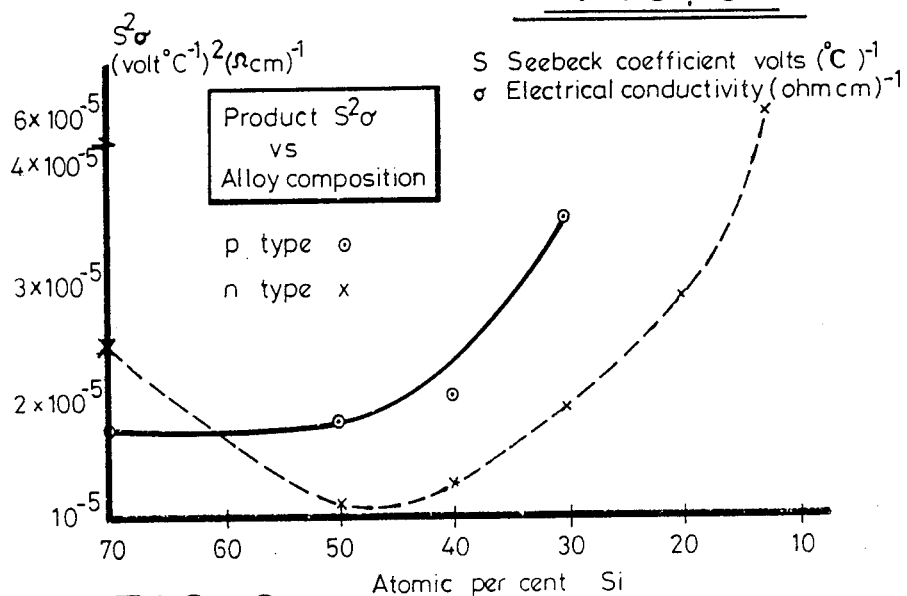
FIG. 6 is a graph of electrical power ouput versus alloy composition for p and n type semi-conductor thermoelectric materials in accordance with the present invention.

Reference is now made to FIG. 6 of the drawings which illustrates a graph of electrical power againt atomic percentage silicon for p and n-type electrical power is determined from $S^2\sigma$ where S is the Seebeck coefficient for the material and $\sigma$ is the conductivity.

It will be seen that for less than 50% silicon, power increases for decreasing silicon and at about 70% and above the electrical power output increases substantially for an n-type alloy. Therefor this graph indicates that for high electrical power, high or low silicon concentrations of n-type alloy should be used. However, from FIG. 4 low silicon concentrations result in high thermal conductivity so this graph indicates that high silicon proportions are preferred.

Figure 7:
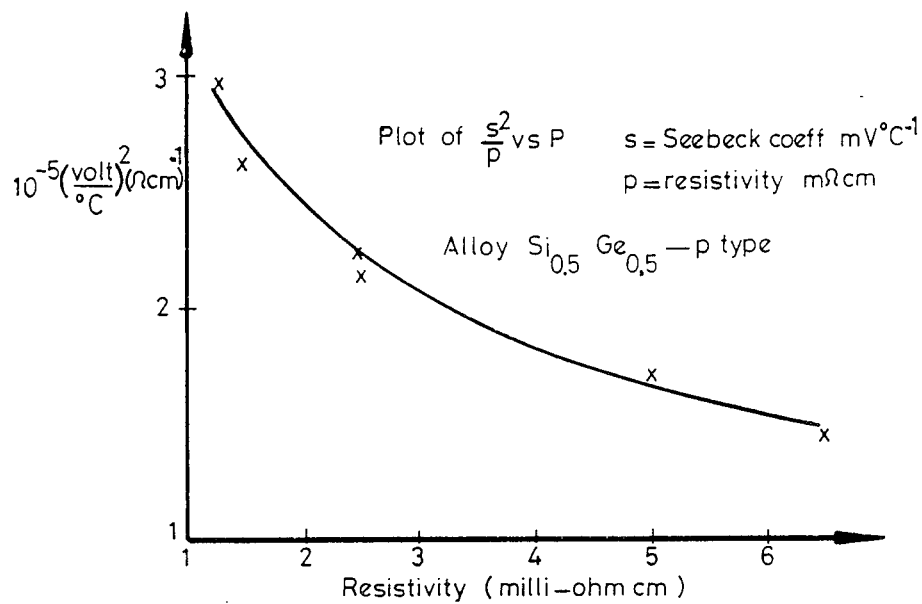
FIG. 7 is a graph of electrical power versus alloy resistivity for a p-type alloy in accordance with an embodiment of the present invention.

Reference is now made to FIG. 7 of the drawings, a graph of electrical power output, as represented the $S^2/\rho$ versus resistivity is shown for a p-type silicon-germanium alloy at 50:50 composition. The power decreases with resistivity and it is desirable that resistivity of no more than 2-2.5 milliohm cm can be used to maximize electrical power output from the thermoelectric material.

Figure 8:
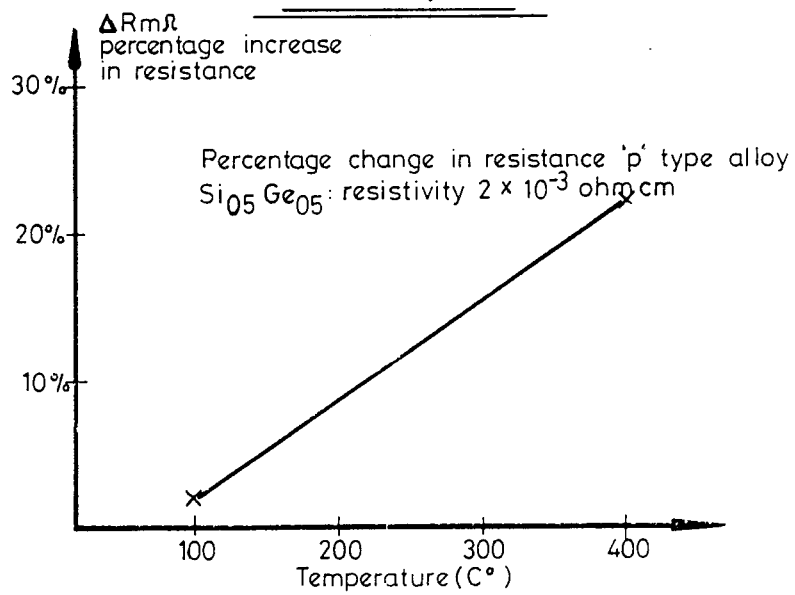
FIG. 8 is a graph of resistance change with temperature in accordance with an embodiment of the present invention; and, FIG. 9 is a graph of figure of merit (Z), or thermoelectric efficiency versus alloy composition for a lead concentration of 0.057 atomic percent for n and p type materials.

FIG. 8 of the drawings shows the percentage change in resistance with temperature for a p-type alloy of Si:Ge in a 50:50 proportion and having a resistivity of $2\times10^{-3}$ ohm cm. It will be seen that the electrical resistance increases with temperature in a linear manner which adversely effects electrical conductivity, however for higher temperatures the thermal conductivity also reduces which cancels the effect of increasing electrical resistance and results in a slight increase in the Seebeck coefficient.

Figure 9:
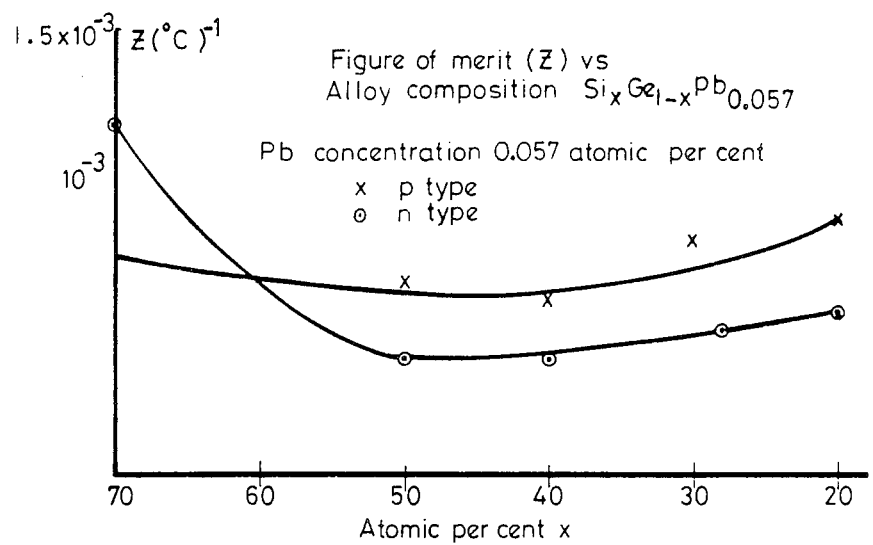

Reference is now made to FIG. 9 which illustrates a graph of Figure of merit (Z) against atomic percent silicon for a p and n-type silicon-germanium alloy composition having a 0.057 atomic percent lead concentration. The figure of merit (Z) is defined as the ratio of electrical power ($S^2\sigma$) to heat loss (thermal conductivity) and is a measure of efficiency of the thermoelectric composition. It is therefore desirable to have Z as high as possible. The FIG. 9 shows that the efficiency of p-type is almost independent of the percentage of silicon whereas the efficiency of the n-type rises rapidly for increasing percentages of silicon above 50%. Thus this graph indicates that for a high Z an n-type alloy is preferable and this is consistent with FIG. 4 which shows that thermal conductivity is reduced for higher silicon percentages.

Thus from the aforedescribed FIGS. 3 through 9 it will be appreciated that a thermoelectric device according to the invention can be obtained having thermoelectric characteristics designed to suit a particular application. The alloy composition can be manufactured as a polycrystalline material using a variety of techniques such as a Bridgaman Stockbarger Crystal growth method for growing crystals in which a flat bottomed or tapered crucible is used to grow the crystal from a point of nucleation near the bottom of the crystal and the crystal is lowered at the same rate as growth to minimise thermal shock. The solidified crystal can be cut into pieces of a predetermined size and shape using a diamond saw.

The following examples illustrate the semi-conductor materials used in the n-and p-doped elements of the above-described cells.

EXAMPLE I

P-doped material

Silicon (20 g.), germanium (22 g.), lead (1.2 g) and boron (7 mg) were placed together in a graphite crucible and heated to slightly above the melting point of the mixture (1500° C.) this temperature then being maintained for a further 2 hours. The resulting melt was then allowed to cool at a controlled rate of approximately 2° C. min$^{-1}$.

The resulting solid ingot was then machined in conventional manner to produce individual elements for use in the above described cell.

The nominal atomic weight percent of the above amount of lead is 0.58% for the liquid phase. However, it will be understood that during transition from the liquid to solid phase the actual weight percent of lead in the phase is determined by the segregation coefficient of the material. The segregation coefficient is the ratio of lead atoms entering the solid phase from the liquid phase. This has not been measured for lead but is believed to be in the region of 0.05 in comparison to the segregation coefficient of tin which is known to be 0.02. The remaining lead imparting atoms remain in the liquid phase until the last part of the polycrystalline ingot is formed and which is then removed.

The actual weight percent can be measured from samples of the solid phase alloy composition and the amount of lead with a segregation coefficient of about 0.05 will produce an actual lead atomic weight percent of 0.03% in the solid phase.

The properties of the semi-conductor material obtained were found to have the following values:

Electrical resistivity: p=2.4 milliohm cm
Density: D=3.3 g cm$^{-3}$
Thermal conductivity K=0.024 watts (cm° C.)$^{-1}$
Seebeck coefficient S=0.22 mV° C.$^{-1}$ Example II n-doped material Silicon (28 g), germanium (31 g) and lead (1.8 g) were added together in a large graphite crucible and heated in an induction furnace up to the melting point of the mixture (1500° C.). At the same time phosphorus (100 mg) was placed in a small graphite crucible which in turn was placed near the bottom of the large crucible and the resulting phosphorous vapour allowed to pass over the molten alloy. The mixture was held at this temperature for 150 minutes. The residual phosphorous vapour was then exhausted from the system and the resulting mixture was allowed to cool at a controlled rate of 2° C. min.$^{-1}$.

The nominal weight percent of lead is 0.87%, however using the segregation coefficient the actual weight percent becomes 0.044%.

The doped alloy ingot obtained was then machined in conventional manner to produce n- doped elements for the above-described cell.

The semi-conductor material obtained was found to have the following properties:

Thermal conductivity: K=0.022 watts (cm° C.)$^{-1}$
Seebeck coefficient: S=0.26 mV° C.$^{-1}$
Electrical resistivity: $\beta$=2.4 milliohm cm Example III p-type Germanium (75 g), silicon (6 g) and Pb (2.5 g) were added together as described in example II. At the same time boron (6 mg) was added and the procedure as for example II followed. The semi-conductor material obtained was found to have the following properties:

Thermal conductivity: 0.035 watts (cm °C.)$^{-1}$
Seebeck coefficient: S=0.3 mV° C.$^{-1}$
Resistivity: P=2.5 milliohm cm
Hole mobility 150-200 cm$^2$ per V.sec Example IV n-type The proportions of silicon, germanium and lead given in example III were combined as aforedescribed and 0.5g arsenic then added and the remaining procedure described in examples II and III followed. It will be understood that final atomic weight percents depend on the segregation coefficient as outlined above. The semi-conductor material obtained was found to have the following properties:

Thermal conductivity K=0.035 watts (cm$^2$C)$^{-1}$
Seebeck coefficient S=0.35 mV° C.$^{-1}$
Resistivity: $\rho$=2.5 milliohm cm
Electron mobility =200-250 cm$^2$ per V.sec

We claim:

1. A thermoelectric alloy composition consisting essentially of from 5% to 95% of silicon, from 95% to 5% germanium, from 0.01% to 0.2% lead and from 0% to 0.2% of tin, all percentages being atomic percentages.

2. A thermoelectric alloy composition as claimed in claim 1 wherein silicon is from 50% to 95%, germanium is from 5% to 50% and lead is from 0.01% to 0.2%.

3. A thermoelectric alloy composition as claimed in claim 1 wherein silicon is 50% to 95%, germanium is 5% to 50% and lead is 0.03% to 0.1%.

4. A thermoelectric alloy composition as claimed in claim 1 wherein lead is from 0.03% to 0.1%.

5. A thermoelectric alloy as claimed in claim 1 wherein silicon is from 50% to 95%, germanium is from 5% to 50%, lead is from 0.01% to 0.2% and tin is from 0 to 0.05%.

6. A thermoelectric alloy as claimed in claim 5 wherein lead is from 0.03% to 0.1%.

7. A thermoelectric semi-conductor material comprising an alloy as claimed in claim 1 and a dopant consisting of one of a p and n type material having a concentration of 10$^{18}$ and to 10$^{20}$ atoms of said dopant material per cubic centimeter of said alloy.

8. A thermoelectric semi-conductor material as claimed in claim 7 wherein said dopant material has a concentration of 10$^{19}$ to 10$^{20}$ atoms of dopant material per cubic centimeter of said alloy.

9. A thermoelectric semi-conductor material as claimed in claim 7 or claim 8 wherein said dopant material is a p-type material selected from elements in Group III of the Periodic Table.

10. A thermoelectric semi-conductor material as claimed in claim 7 or claim 8 wherein said dopant material is an n-type material selected from elements in group V of the Periodic Table.

11. A thermoelectric semi-conductor material comprising an alloy as claimed in claim 6 wherein said dopant material has a concentration of 10$^{19}$ to 10$^{20}$ of atoms of one of a p and n-type dopant material per cubic centimeter of alloy.

12. A thermoelectric device consisting essentially of at least one p-type semi-conductor material portion and at least one n-type semi-conductor material portion as claimed in claim 7, said p-type material portion having a first end electrically coupled to a first end of said n-type material portion to form a p-n coupling, said p-n coupling having first electrical contact means coupled thereto and being disposible in proximity to a heat source, said p and n-type portions having respective second ends for receiving respective electrical contacts and being such that, in use, in response to thermal energy applied to said p-n coupling electrical power can be obtained by connecting said electrical load between said electrical contacts.

13. A thermoelectric device as claimed in claim 12, wherein a plurality of p-n couplings are provided and adjacent p and n material portions being electrically connected in series and physically arranged in parallel, and, in use, electrical power being obtainable between spaced second ends of respective p and n material portions.

14. A thermoelectric device comprising at least one p-type semi-conductor material portion as claimed in claim 11, wherein said p-type material portion having a first end electrically coupled to a first end of sid n-type material portion to form a p-n coupling, said p-n coupling having first electrical contact means coupled thereto and being disposible in proximity to a heat source, said p and n-type portions having respective second ends for receiving respective electrical contacts and being connectable to an electrical load, the arrangement being such that, in use, in response to thermal energy applied to said p-n couplings electrical power can be obtained by connecting said electrical load between said electrical contacts.

15. A thermoelectric device as claimed in claim 12, wherein a plurality of p-n couplings are provided and adjacent p and n material portions being electrically connected in series and physically arranged in parallel and in use, electrical power being obtainable between spaced second ends of respective p and n material portions.

16. A thermoelectric energy conversion device comprising a thermal energy source, and a thermoelectric device as claimed in claim 12, the arrangement being such that, in use, thermal energy from said thermal energy source is applied to said thermoelectric device to provide power from between said electrical contacts.

17. A thermoelectric device as claimed in claim 16 wherein heat source is a combusting fuel gas.

18. A thermoelectric energy conversion device comprising a thermal energy source in the form of a combustion fuel gas, a thermoelectric device as claimed in claim 15, the arrangement being such that, in use, the combusting fuel gas applies thermal energy to the thermoelectric device and said thermal energy is connected to electrical energy which can be obtained by coupling an electrical load between said electrical contacts.

19. A method of converting thermal energy to electrical energy using a thermoelectric device as claimed in claim 13 or 15 said method comprising the steps of heating said p-n coupling to a temperature of up to 1000° C., and coupling the electrical contacts of said device across an electrical load, and extracting electrical energy from said load.

* * * * *